United States Patent
Hong et al.

(10) Patent No.: US 7,968,935 B2
(45) Date of Patent: Jun. 28, 2011

(54) RECONFIGURABLE SEMICONDUCTOR DEVICE

(75) Inventors: Seunghun Hong, Seoul (KR); Sung Myung, Daejeon (KR); Kwang Heo, Seoul (KR)

(73) Assignee: Seoul National University Research & Development Business Foundation, Seoul (KR)

( * ) Notice: Subject to any disclaimer, the term of this patent is extended or adjusted under 35 U.S.C. 154(b) by 280 days.

(21) Appl. No.: 12/197,961

(22) Filed: Aug. 25, 2008

(65) Prior Publication Data

US 2010/0044777 A1 Feb. 25, 2010

(51) Int. Cl.
*H01L 29/792* (2006.01)
*H01L 21/28* (2006.01)

(52) U.S. Cl. . 257/326; 257/324; 257/322; 257/E29.309; 438/591; 438/266

(58) Field of Classification Search .......... 257/300–326, 257/E21.21, E29.309
See application file for complete search history.

(56) References Cited

U.S. PATENT DOCUMENTS

| | | | |
|---|---|---|---|
| 2006/0197460 A1* | 9/2006 | Lin et al. | 315/169.3 |
| 2008/0001183 A1* | 1/2008 | Kapoor | 257/256 |
| 2009/0080245 A1* | 3/2009 | Lutze et al. | 365/185.02 |
| 2009/0250689 A1* | 10/2009 | Colli | 257/39 |

FOREIGN PATENT DOCUMENTS

| | | |
|---|---|---|
| KR | 1020050084447 A | 8/2005 |
| KR | 1020060042729 A | 5/2006 |
| KR | 1020060053068 A | 5/2006 |
| KR | 1020070090226 A | 9/2007 |

OTHER PUBLICATIONS

Korean Intellectual Property Office Notice of Decision to Grant Patent in Application No. 10-2008-0116502.

\* cited by examiner

*Primary Examiner* — N Drew Richards
*Assistant Examiner* — Mamadou Diallo
(74) *Attorney, Agent, or Firm* — Knobbe, Martens, Olson & Bear, LLP

(57) ABSTRACT

A reconfigurable semiconductor device is disclosed. The semiconductor device includes a substrate, a first insulating material formed on the substrate, two channels having different polarities, a plurality of terminal electrodes formed on the insulating material and coupled in common with the channels at their opposite ends, a second insulating material formed on the terminal electrodes, and a control gate formed on the second insulating material. The channels have different polarity and a charge storage layer is formed inside the second insulating material. The control gate is applied with a forward bias or a reverse bias and then the bias is cut off. The voltage-current characteristics of the semiconductor device are changed according to an electrical charge created in the charge storage layer.

26 Claims, 13 Drawing Sheets

(a)

(b)

(a)

(b)

RECONFIGURABLE SEMICONDUCTOR DEVICE

TECHNICAL FIELD

The described technology relates generally to semiconductors and, more particularly, to a reconfigurable semiconductor device and a method of manufacturing the same.

BACKGROUND

A wide variety of semiconductor devices are currently available.

Semiconductor devices are typically composed of materials that have had their electrical characteristics altered by the addition of impurities. If an electrical signal is applied to a semiconductor device, it will operate predictably according to the electrical properties of the materials included in the semiconductor device.

Semiconductor devices can be classified as diodes, Bipolar Junction Transistors (BJT), or Field Effect Transistors (FET), according to the semiconductor material components, the layer structure of the semiconductor material, and the operational characteristics.

DETAILED DESCRIPTION

A semiconductor device having improved electrical characteristics and which may be used for various purposes is provided. The semiconductor device according to the various embodiments of the present disclosure is a device having reconfigurable electrical characteristics. Accordingly, the electrical characteristics of the semiconductor device can be controlled as desired.

Hereinafter, the semiconductor device and a method of manufacturing the same according to an example embodiment of the present disclosure are described. The figures attached to the present disclosure are for the convenience of explanation and the shapes of layers, electrodes and members may be exaggerated or abridged.

Figure 1:
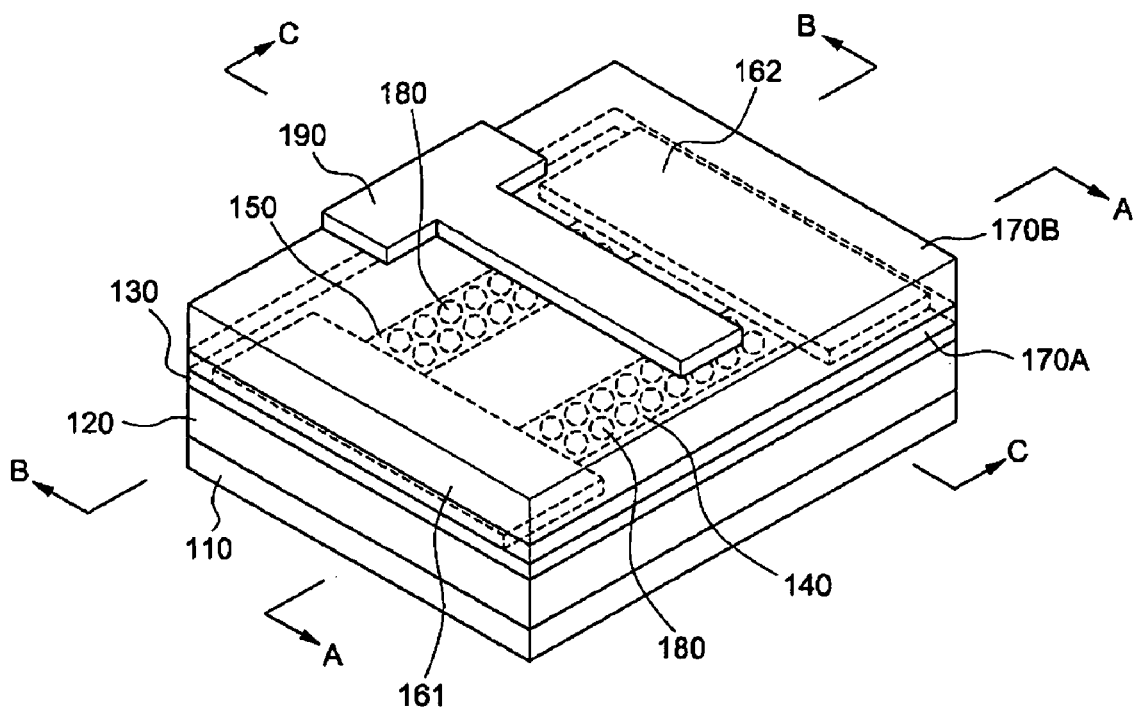
FIG. 1 is a perspective view of a semiconductor device according to one embodiment.
Figure 2:
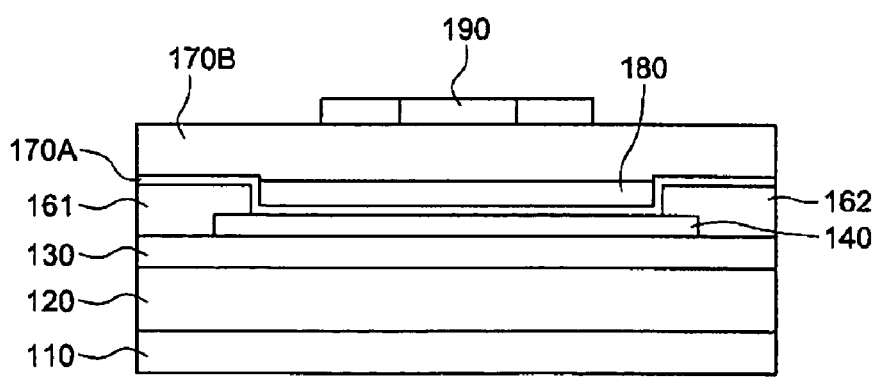
FIG. 2 is a cross sectional view based on a cross section A-A of the semiconductor device of FIG. 1.
Figure 3:
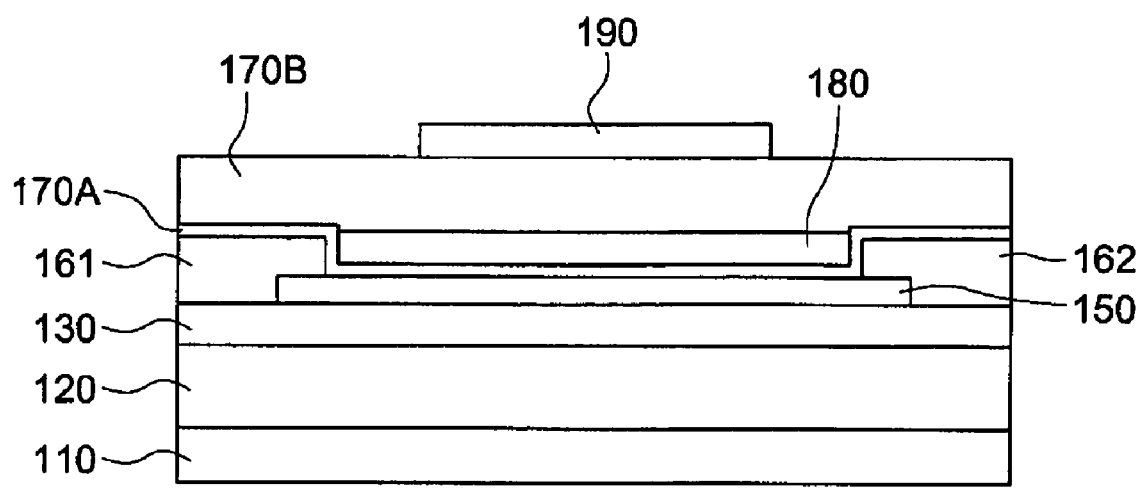
FIG. 3 is a cross sectional view based on a cross section B-B of the semiconductor device of FIG. 1.

FIG. 1 is a perspective view of the semiconductor device according to one example embodiment. FIG. 2 is a cross sectional view based on a cross section A-A of the semiconductor device of FIG. 1. FIG. 3 is a cross sectional view based on a cross section B-B of the semiconductor device of FIG. 1.

As illustrated, the semiconductor device of FIG. 1 to FIG. 3 includes a first gate 110, a substrate 120, a first insulating layer 130, a first channel 140, a second channel 150, terminal electrodes 161 and 162, second insulating layers 170A and 170B, a charge storage layer 180 and a second gate 190.

The first gate 110 and the second gate 190 are electrodes supplied with an external power source. If the first gate 110 and/or the second gate 190 are supplied with a power source, the semiconductor device of FIG. 1 may have an electrical field applied to it by the externally supplied power source.

The first gate 110 and the second gate 190 may be formed with various materials. For example, the gates may be formed with metallic materials such as gold (Au) or may be formed with polymers such as poly silicon. The first gate 110 and the second gate 190 may be formed with the same material or may be formed with different materials. The first gate 110 and the second gate 190 may be called by various names such as top gate, back gate, and so on, according to the installed location of the gate. Moreover, the gate may be called a control gate if it is used for control and may be called an operating gate if it is used for operations like amplification or switching.

The substrate 120 is formed on the first gate 110. The substrate 120 may be a doped n-type or p-type semiconductor substrate, or may be an un-doped semiconductor substrate.

The first insulating layer 130 is formed on the substrate 120.

Two or more channels 140 and 150 and two or more terminal electrodes 161 and 162 are provided on the first insulating layer 130. The terminal electrodes 161 and 162 are coupled in common with the channels 140 and 150 at their opposite ends.

The channels 140 and 150 may be a semiconductor layer having a first polarity and a semiconductor layer having a second polarity. For example, the first channel 140 may be a p-type doped silicon film and the second channel 150 may be an n-type doped silicon film. As another example, the first channel 140 may be a p-type doped nanowire, and the second channel 150 may be an n-type doped nanowire. The nanowire may be fabricated from various materials such as, by way of example, Si, Ge, ZnO, GaAs, GaP, GaN, CdSe, InO, InP, SnO, CdTe, BaSrO, $V_2O_5$ and the like. The channels 140 and 150 may be fabricated from the same material or from different materials.

Any one of the first terminal electrode 161 and the second terminal electrode 162 may be a source electrode and the other may be a drain electrode. The terminal electrodes 161 and 162 may be fabricated from gold or titanium.

Second insulating layers 170A and 170B are formed on the terminal electrodes 161 and 162 and on the channels 140 and 150. Further, the charge storage layer 180, which is capable of storing an electrical charge, may be formed inside the second insulating layers 170A and 170B. The charge storage layer 180 may be in a location corresponding to the channels 140 and 150. Since the charge storage layer 180 is formed inside the second insulating layers 170A and 170B, the charge storage layer 180 is insulated from the second gate 190, and the channels 140 and 150. That is, the charge storage layer 180 is electrically floated.

The second insulating layers 170A and 170B may be divided into a lower insulating sub-layer (e.g., second insulating layer 170A) and an upper insulating sub-layer (e.g., second insulating layer 170B). Hereinafter, the lower insulating sub-layer may be called the second insulating layer and the upper insulating sub-layer may be called the third insulating layer.

The charge storage layer 180 may be formed on the lower insulating sub-layer. Since the lower insulating sub-layer is relatively thin, the charge storage layer 180 may be charged due to a tunneling phenomenon if a bias is applied to the second gate 190.

The second gate 190 is formed on the upper insulating sub-layer. The second gate 190 is insulated from the charge storage layer 180, and the channels 140 and 150.

Figure 4:
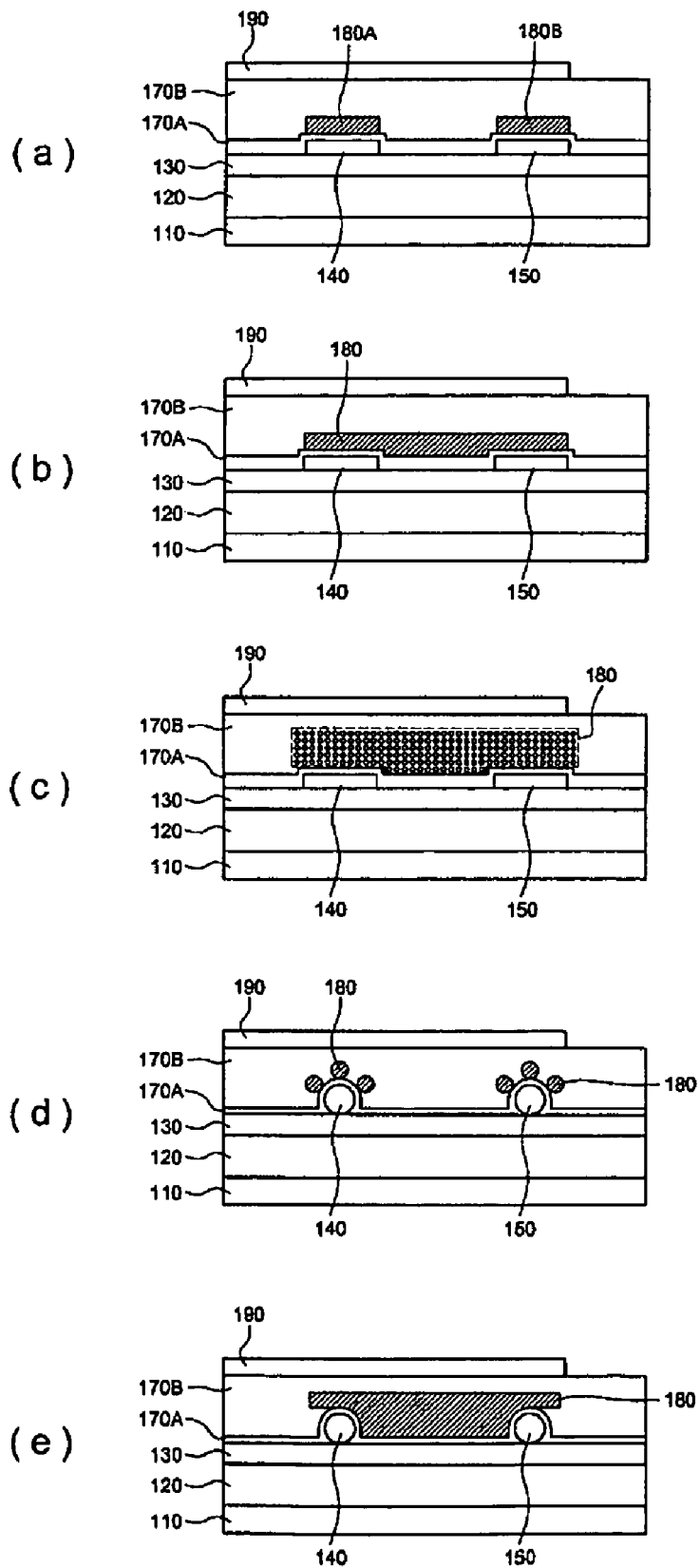
FIGS. 4(a)-4(e) are cross sectional views based on a cross section C-C of the semiconductor device of FIG. 1.

FIGS. 4(a)-4(e) are cross sectional views based on a cross section C-C of the semiconductor device of FIG. 1. In particular, FIG. 4(a) illustrates one example of a layered structure of the semiconductor device. As shown in FIG. 4(a), two or more charge storage layers 180A and 180B may be provided. In this case, one charge storage layer 180A may be located to correspond with the first channel 140 and the other charge storage layer 180B may be located to correspond with the second channel 150.

FIG. 4(b) through FIG. 4(e) illustrate a layered structure of a semiconductor device according to other embodiments of the present disclosure. First of all, as shown in FIG. 4(b), a charge storage layer may be one planar member. In this case, the charge storage layer 180 may be formed in a size large enough to correspond with both the first channel 140 and the second channel 150.

Further, as shown in FIG. 4(c), the charge storage layer 180 may be a region including a plurality of conductive particles. For example, the plurality of conductive particles may be nanoparticles. When the charge storage layer 180 includes a plurality of conductive particles, each conductive particle may store electrical charge. If electrical charge is stored by a plurality of conductive particles, then, even if a leak occurs, all of the electrical charge does not leak at once.

Further, as shown in FIG. 4(d), the charge storage layer 180 may be a region including a plurality of conductive particles and the channels 140 and 150 may include at least one nanowire. Further, as shown in FIG. 4E, the charge storage layer 180 may be one planar member and the channels 140 and 150 may include at least one nanowire.

As described hereinabove, the terminal electrodes 161 and 162 are coupled in common not only with the first channel 140 of first polarity but also with the second channel 150 of second polarity at their opposite ends. Accordingly, the semiconductor device of FIG. 1 has both of the different electrical characteristics generated by the channels 140 and 150 of first polarity and second polarity.

For example, if the first channel 140 is a p-type nanowire or semiconductor layer and the second channel 150 is an n-type nanowire or semiconductor layer, a voltage-current characteristic of the semiconductor device may be similar to that shown in FIGS. 5(a)-5(c), which is further described below.

Figure 5:
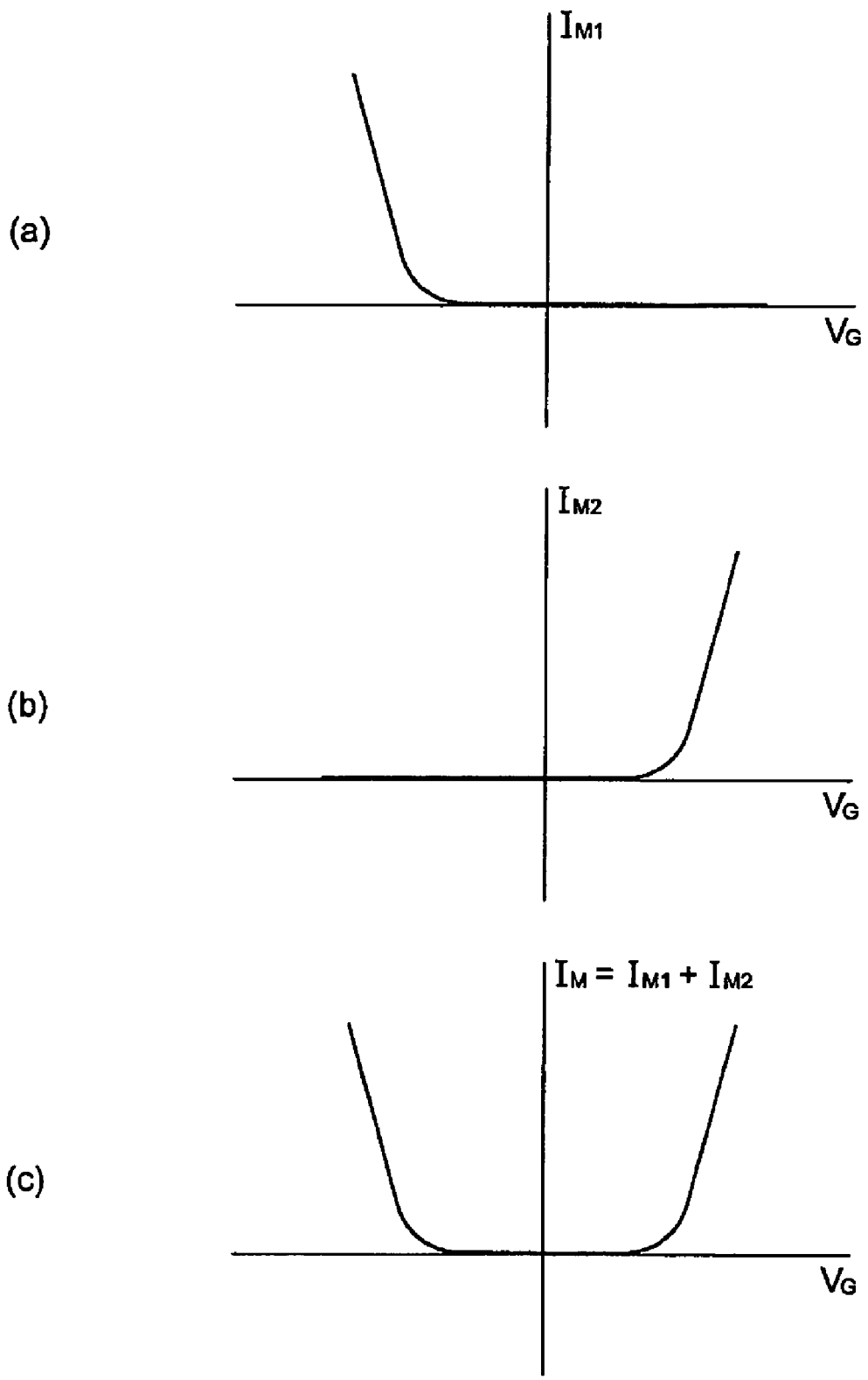
FIGS. 5(a)-5(c) are graphs illustrating a voltage-current characteristic of the semiconductor device of FIG. 1.

FIGS. 5(a)-5(c) are graphs illustrating a voltage-current characteristic of the semiconductor device of FIG. 1. FIG. 5(a) illustrates a voltage-current characteristic between a first gate voltage $V_G$ applied to the first gate 110 and the p-type first channel 140. The voltage-current characteristics shown in FIG. 5A correspond to a conventional p-type Field Effect Transistor (FET). As shown in FIG. 5(a), if the absolute value of a reverse bias applied to the first gate 110 does not reach a critical value, the current $I_{M1}$ does not flow through the p-type first channel 140. However, if the absolute value of a reverse bias applied to the first gate 110 exceeds the critical value, the current $I_{M1}$ flows through the p-type first channel 140.

Meanwhile, FIG. 5(b) illustrates a voltage-current characteristic between a first gate voltage $V_G$ applied to the first gate 110 and the n-type second channel 150. The voltage-current characteristics shown in FIG. 5(b) correspond to a conventional n-type Field Effect Transistor (FET). As shown in FIG. 5(b), if a forward bias applied to the first gate 110 is less than a critical value, the current $I_{M2}$ does not flow through the n-type second channel 150. However, if the absolute value of a forward bias applied to the first gate 110 exceeds the critical value, current $I_{M2}$ flows through the n-type second channel 150.

Since the first channel 140 and the second channel 150 are coupled in parallel with the terminal electrodes 161 and 162, a final characteristic of the current ($I_M=I_{M1}+I_{M2}$) flowing through the terminal electrodes 161 and 162 is like that shown in FIG. 5(c). That is, the semiconductor device of FIG. 1 may have the characteristics of both a p-type FET and an n-type FET.

The characteristics of the first gate voltage $V_G$ and the current $I_M$ flowing through the terminal electrodes of the semiconductor device according to one example embodiment of the present disclosure are adjustable by a forward/reverse bias applied to the second gate 190. Hereinafter, a method of adjusting the characteristics of first gate voltage $V_G$ and the current $I_M$ of the semiconductor device through adjusting the bias applied to the second gate 190 is described.

A first method of adjusting the characteristics of the first gate voltage $V_G$ and current $I_M$ of the semiconductor device is applying a forward bias to the second gate 190 and then cutting off the bias in order to control the p-type channel characteristics.

Figure 6:
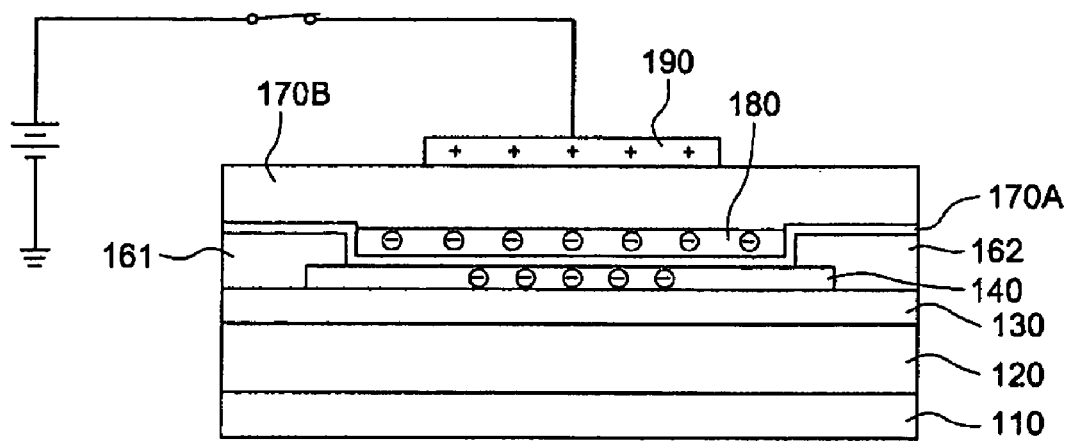
FIG. 6 is a diagram illustrating the polarity of electrical charge accumulated in each layer when a forward bias is applied to a gate of the semiconductor device of FIG. 1.

FIG. 6 is a diagram illustrating the polarity of electrical charge accumulated in each layer when a forward bias is applied to a gate of the semiconductor device of FIG. 1. In particular, FIG. 6 illustrates the polarity of electrical charge accumulated in each layer when a forward bias is applied to the second gate 190. When a forward bias is applied to the second gate 190, negative electrical charge accumulates in the charge storage layer 180 due to a tunneling phenomenon. Further, negative electrical charge also accumulates in the p-type first channel 140 because of the strong external forward bias.

Figure 7:
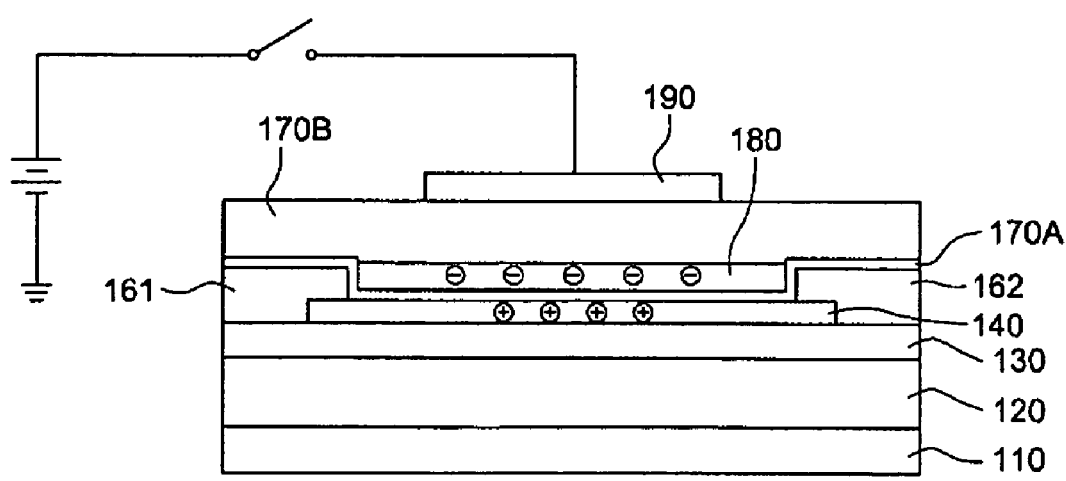
FIG. 7 is a diagram illustrating a bias cut off after applying a forward bias to a gate of the semiconductor device of FIG. 1.

FIG. 7 is a diagram illustrating a bias cut off after applying a forward bias to a gate of the semiconductor device of FIG. 1. As shown in FIG. 7, when the external bias is not applied further through the second gate 190, negative electrical charge is continuously stored in the charge storage layer 180. However, positive electrical charge accumulates in the p-type first channel 140 because of the negative electrical charge remaining in the charge storage layer 180.

As illustrated in FIG. 6 and FIG. 7, when the application of bias is cut off after an application of forward bias, the characteristics of the first gate voltage $V_G$ and current $I_{M1}$ change because of the negative electrical charge stored in the charge storage layer 180. That is, the number of positive carriers in the first channel 140 is increased due to an electrical field generated by the negative electrical charge stored in the charge storage layer 180, and the characteristics of the first gate voltage $V_G$ and current $I_{M1}$ change according to the change in the number of carriers.

Figure 8:
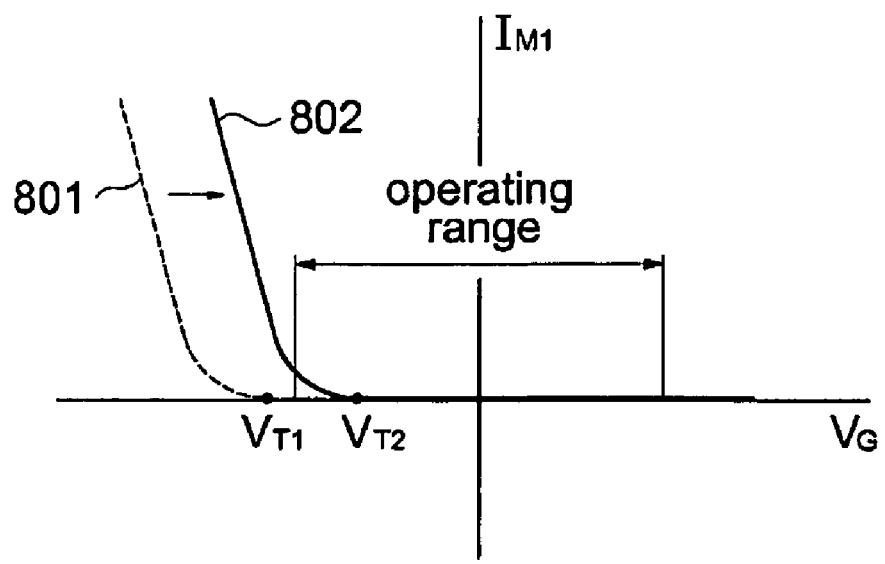
FIG. 8 is a graph illustrating the change in the characteristics between a gate and a channel of the semiconductor device of FIG. 1.

FIG. 8 is a graph illustrating the change in the characteristics between a gate and a channel of the semiconductor device of FIG. 1. In particular, FIG. 8 illustrates the change in the characteristics between the first gate voltage $V_G$ and the current $I_{M1}$ flowing through the p-type first channel. If a forward bias is applied to the second gate 190 and then cut off, the characteristics of the first gate voltage $V_G$ and the current $I_{M1}$ flowing through the first channel change as shown in FIG. 8. For example, the curve of the first gate voltage $V_G$-current $I_{M1}$ is shifted from the first curve 801 to the second curve 802 according to the changed characteristics.

The extent that the first gate voltage $V_G$-current $I_{M1}$ curve is shifted is determined by the amount of forward bias applied to the second gate 190. Therefore, if the amount of the forward bias applied to the gate 190 is adjusted, the critical value of the gate electrical potential at which the current $I_{M1}$ through the first channel begins to flow may be changed from $V_{T1}$ to $V_{T2}$.

It is generally true that the electrical potential of an FET device gate is determined for a preset region, namely over a predetermined operating range. Therefore, if the curve of the first gate voltage $V_G$-current $I_{M1}$ is shifted as shown in FIG. 8, an operation corresponding to that of a conventional p-type enhanced-mode FET may be performed within the operation range of the first gate 190.

Meanwhile, a reverse bias may be applied to the second gate 190 in order to control the characteristics of a p-type channel. When the reverse bias is applied to the second gate 190 and then cut off, the gate voltage $V_G$-current $I_{M1}$ curve of FIG. 8 is shifted to the left side. When the reverse bias is applied to the second gate 190, positive electrical charge accumulates in the charge storage layer 180 and positive electrical charge also accumulates in the p-type first channel 140. Then, when the application of reverse bias is cut off, the positive electrical charge is continuously stored in the charge storage layer 180 and the number of positive carriers in the first channel 140 is decreased due to an electrical field generated from the charge storage layer 180. Consequently, if the application of bias to the second gate 190 is cut off after applying the reverse bias, the gate voltage $V_G$-current $I_{M1}$ curve shown in FIG. 8 is shifted to the left side since the number of positive carriers in the first channel 140 is decreased.

Hereinafter, a second method to adjust the $V_G$-$I_M$ characteristic of the semiconductor device is described. The second method proposed in the present disclosure comprises applying a reverse bias to the second gate 190 and then cutting off the bias in order to control the characteristics like that of an n-type channel.

Figure 9:
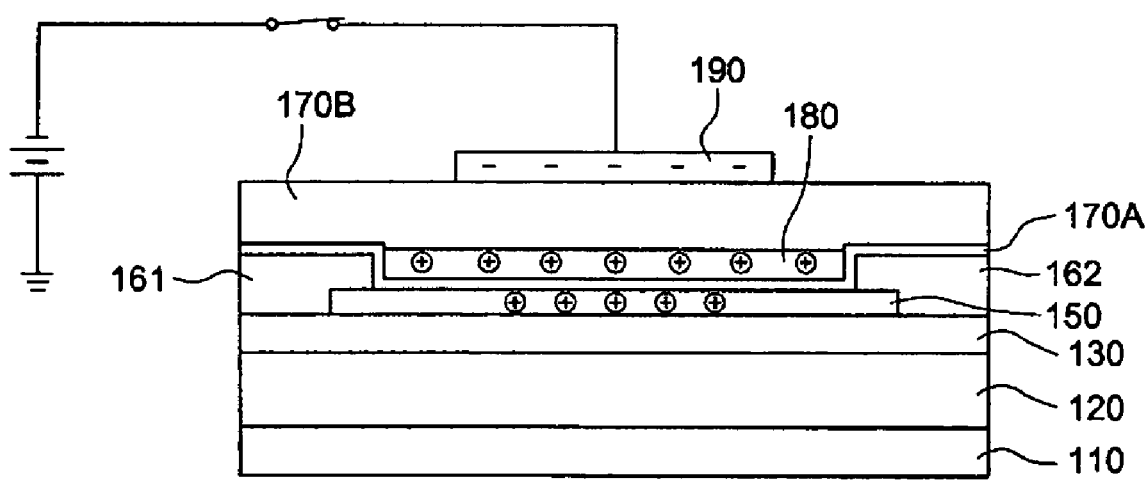
FIG. 9 is a diagram illustrating the polarity of electrical charge accumulated in each layer when a reverse bias is applied to a gate of the semiconductor device of FIG. 1.

FIG. 9 is a diagram illustrating the polarity of electrical charge accumulated in each layer when a reverse bias is applied to a gate of the semiconductor device of FIG. 1. In particular, FIG. 9 illustrates the polarity of electrical charge accumulated in each layer when a reverse bias is applied to the second gate 190. When the reverse bias is applied to the second gate 190, positive electrical charge accumulates in the charge storage layer 180 due to a tunneling phenomenon. Further, negative electrical charge also accumulates in the n-type second channel 150 because of the strong external forward bias.

Figure 10:
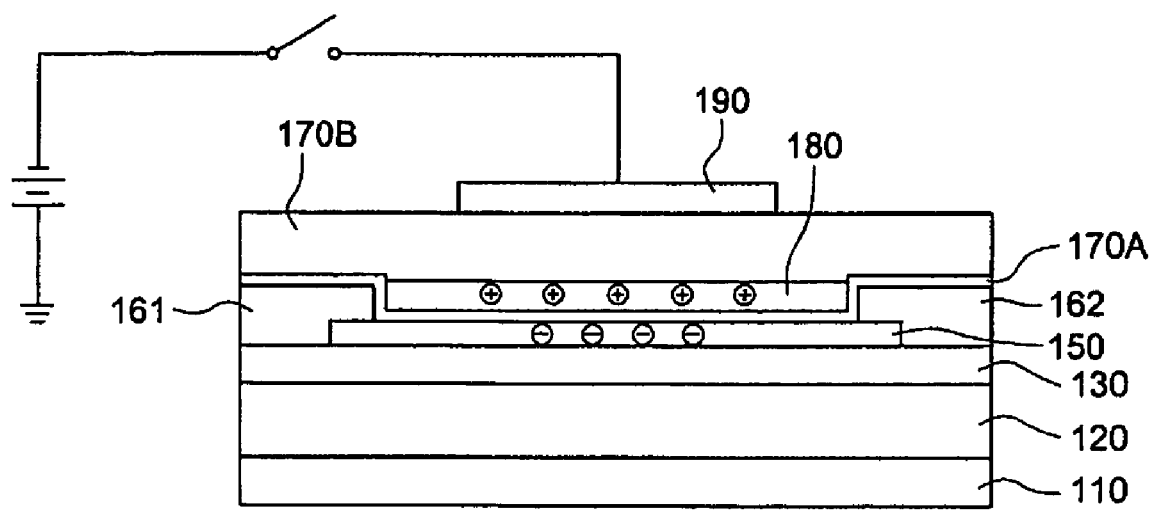
FIG. 10 is a diagram illustrating cutting off the bias to a gate of the semiconductor device of FIG. 1.

FIG. 10 is a diagram illustrating cutting off the bias to a gate of the semiconductor device of FIG. 1. In particular, FIG. 10 illustrates a state of a bias cut off after applying a reverse bias. As shown in FIG. 10, when the external bias is not applied further to the second gate 190, positive electrical charge is continuously stored in the charge storage layer 180. However, negative electrical charge accumulates in the n-type second channel 150 because of the positive electrical charge remaining in the charge storage layer 180.

As illustrated in FIG. 9 and FIG. 10, if the application of bias is cut off after an application of reverse bias, the characteristics of the first gate voltage $V_G$ and current $I_{M2}$ change due to the positive electrical charge stored in the charge storage layer 180. That is, the number of negative carriers in the second channel 150 is increased because of an electrical field generated by the positive electrical charge stored in the charge storage layer 180, and the characteristic of the first gate voltage $V_G$ and current $I_{M2}$ changes according to the change in the number of carriers.

Figure 11:
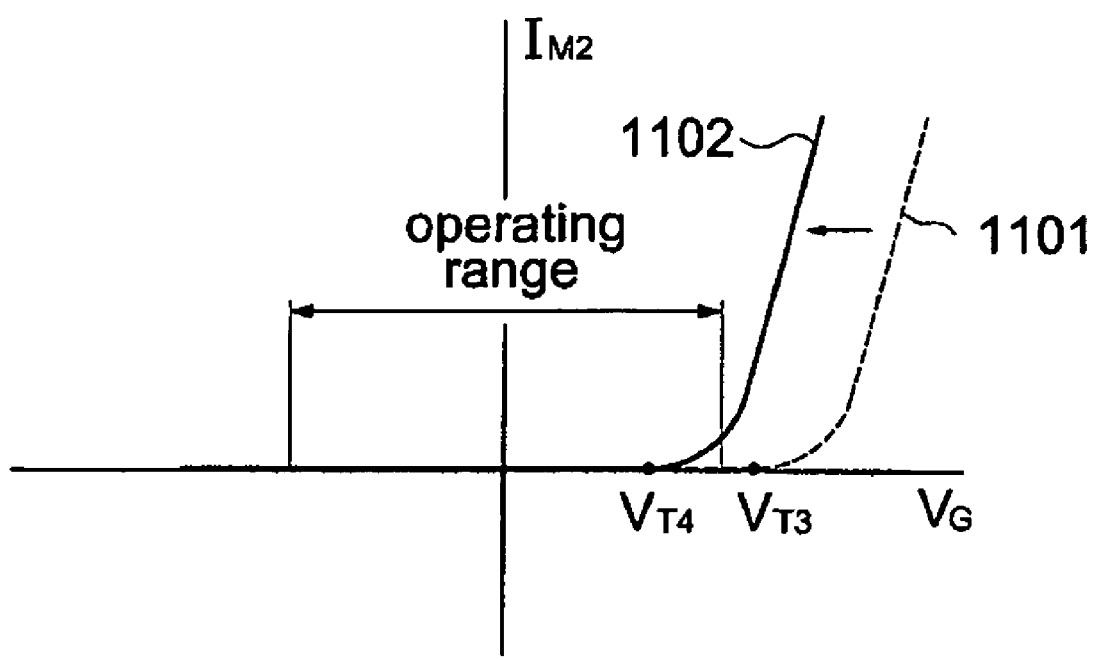
FIG. 11 is a graph illustrating the change in the characteristics between a gate and a channel of the semiconductor device of FIG. 1.

FIG. 11 is a graph illustrating the change in the characteristics between a gate and a channel of the semiconductor device of FIG. 1. In particular, FIG. 11 illustrates the change in the characteristics between the first gate voltage $V_G$ and the current $I_{M2}$ flowing through the second channel of n-type. If a reverse bias is applied to the second gate 190 and then cut off, the characteristics of the first gate voltage $V_G$ and the current $I_{M2}$ flowing through the second channel change as shown in FIG. 11. For example, the first gate voltage $V_G$-current $I_{M2}$ curve is shifted from a first curve 1101 to a second curve 1102, according to the changed characteristics.

The extent that the first gate voltage $V_G$-current $I_{M2}$ curve is shifted is determined by the amount of the reverse bias applied to the second gate 190. Therefore, when the amount of the reverse bias applied to the gate 190 is adjusted, the critical value of the gate electrical potential at which the current $I_{M2}$ through the second channel begins to flow may be reduced from $V_{T3}$ to $V_{T4}$.

If the curve of the first gate voltage $V_G$-current $I_{M2}$ is shifted as shown in FIG. 11, an operation corresponding to a conventional n-type enhanced-mode FET may be performed within the operating range of the first gate 190.

Meanwhile, a forward bias may be applied to the second gate 190 in order to control the characteristics of an n-type channel. When the forward bias is applied to the second gate 190 and then cut off, the gate voltage $V_G$-current $I_{M2}$ curve of FIG. 11 is shifted to the right side. When the forward bias is applied to the second gate 190, negative electrical charge accumulates in the charge storage layer 180 and negative electrical charge also accumulates in the n-type first channel 150. Then, when the application of the forward bias is cut off, the negative electrical charge is continuously stored in the charge storage layer 180 and the number of negative carriers in the second channel 150 is decreased because of an electrical field generated in the charge storage layer 180. Consequently, if the application of the bias is cut off to the second gate 190 after applying the forward bias, the gate voltage $V_G$-current $I_{M2}$ curve of FIG. 11 is shifted to the right side since the number of negative carriers in the second channel 150 is decreased.

Figure 12:
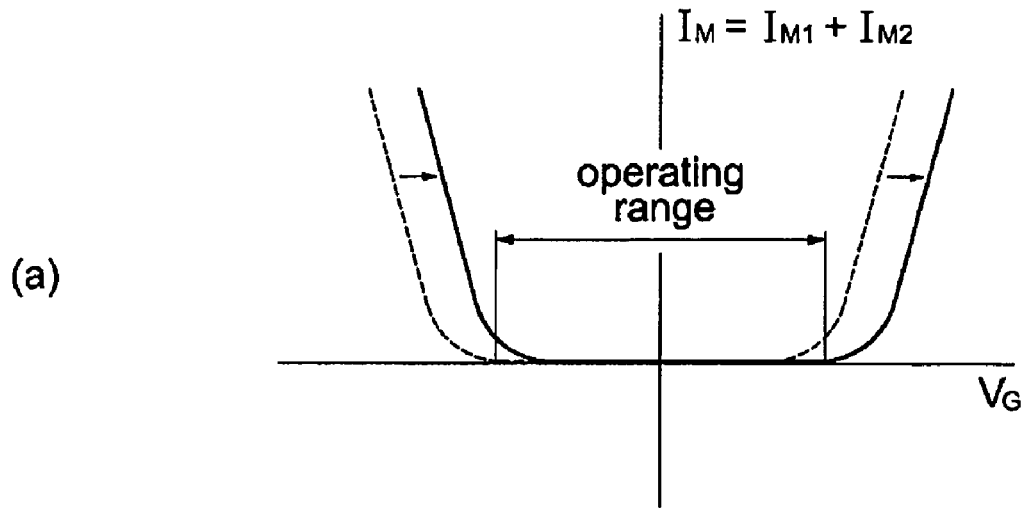
FIGS. 12(a) and 12(b) are graphs illustrating voltage-current characteristics of the semiconductor device of FIG. 1.
Figure 12:
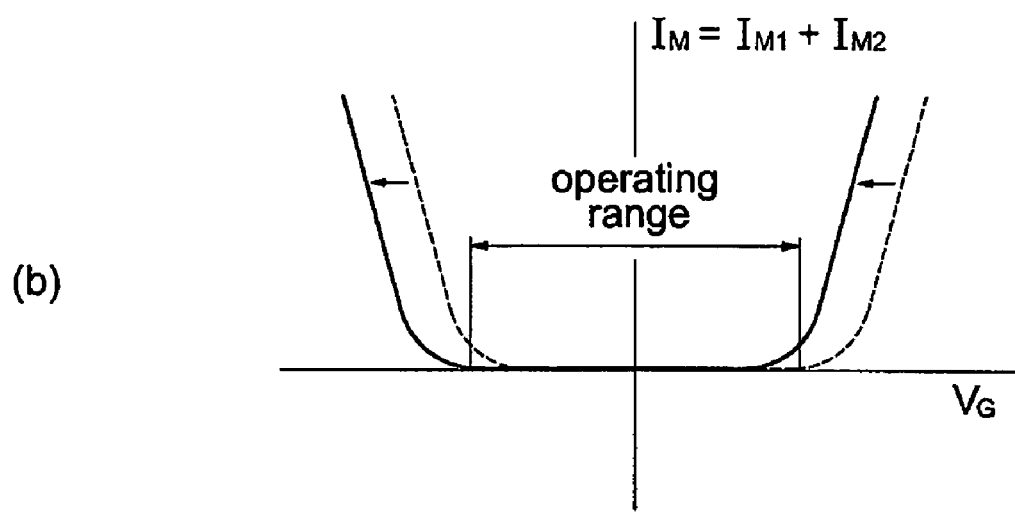

FIGS. 12(a) and 12(b) are graphs illustrating voltage-current characteristics of the semiconductor device of FIG. 1. In particular, FIGS. 12(a) and 12(b) illustrate a voltage $V_G$-current $I_M$ curve of the semiconductor device according to one example embodiment of the present disclosure. As described hereinabove, when the bias is cut off after applying the forward bias to the second gate 190, the voltage $V_G$-current $I_M$ curve is shifted to the right side as shown in FIG. 12(a). Further, when the bias is cut off after applying the reverse bias to the second gate 190, the voltage $V_G$-current $I_M$ curve is shifted to the left side as shown in FIG. 12(b).

As described hereinabove, the extent that the first gate voltage $V_G$-current $I_M$ curve is shifted is determined by an amount of a bias applied to the second gate 190. Therefore, by adjusting an amount of forward bias, the semiconductor of the present disclosure may be used as a conventional p-type FET device. Further, if it is desired to discontinue an operation as a p-type FET device and to start an operation as an n-type FET, the semiconductor device may be used as a conventional n-type FET device by applying a reverse bias and then cutting off the applied reverse bias.

Hereinafter, another embodiment different from the example embodiment described hereinabove is described.

Figure 13:
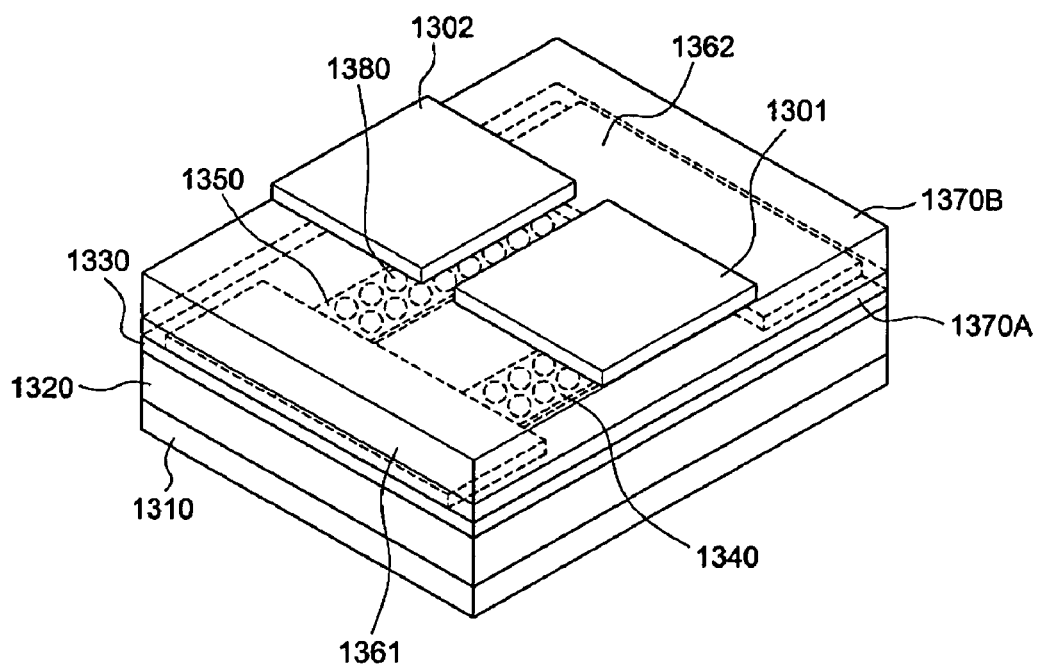
FIG. 13 is a perspective view of a semiconductor device according to another embodiment.

FIG. 13 is a perspective view of a semiconductor device according to another embodiment. As illustrated, the semiconductor device of FIG. 13 includes a first gate 1310, a substrate 1320, a first insulating layer 1330, a first channel 1340, a second channel 1350, terminal electrodes 1361 and 1362, second insulating layers 1370A and 1370B, and a charge storage layer 1380. Further, the semiconductor device of FIG. 13 includes at least two top gates on the second insulating layers 1370A and 1370B. The at least two top gates may include a first top gate 1301 corresponding with the first channel 1340 and a second top gate 1302 corresponding with the second channel 1350. In the semiconductor device of FIG. 13, if the two top gates 1301 and 1302 are formed, the electrical characteristics of the semiconductor device may be further improved.

Figure 14:
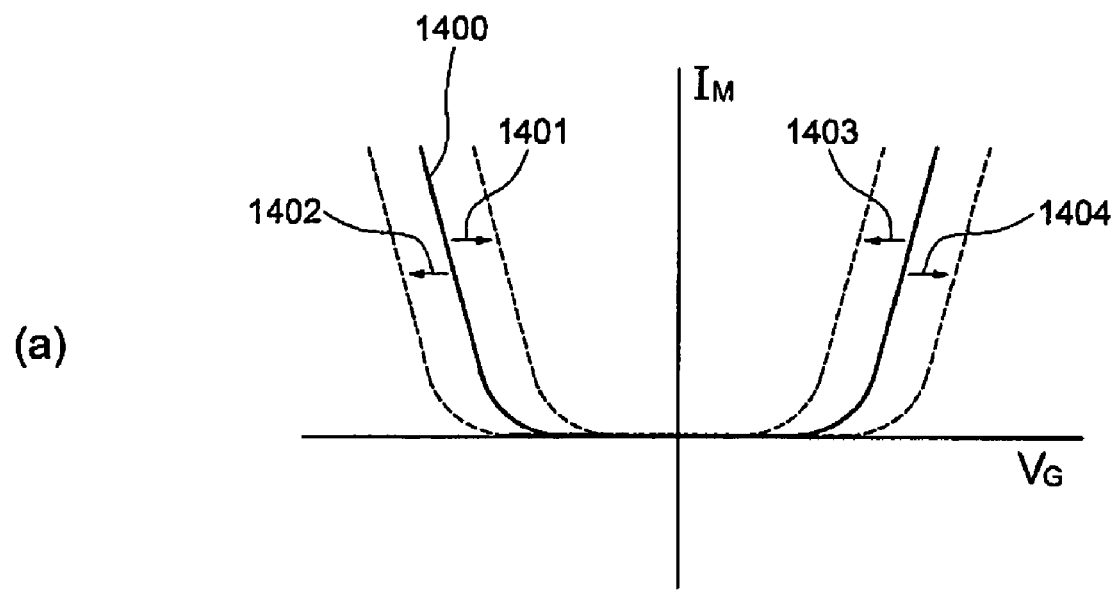
FIGS. 14(a) and 14(b) are graphs illustrating a voltage-current characteristic of the semiconductor device of FIG. 13.
Figure 14:
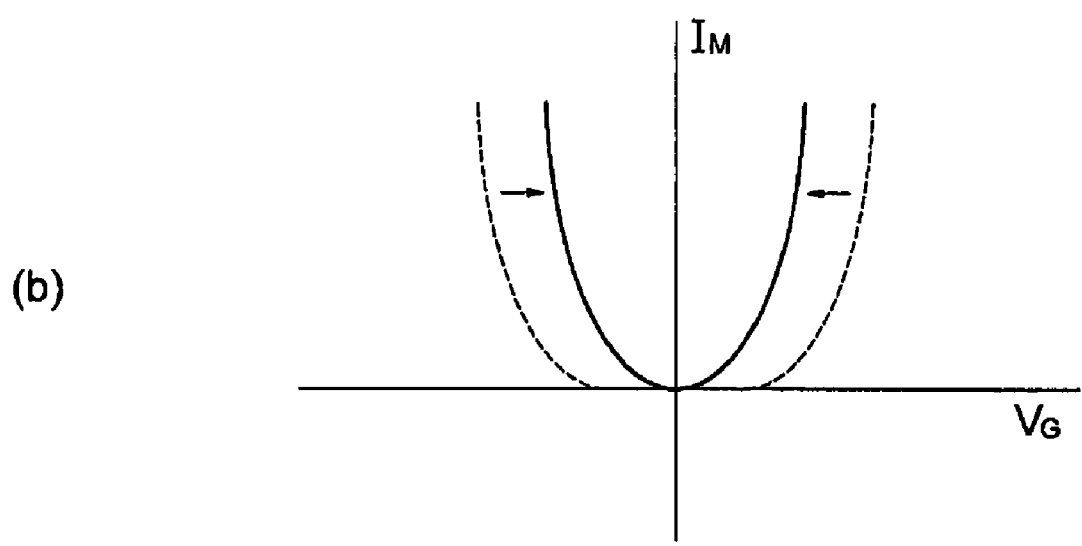

FIGS. 14(a) and 14(b) are graphs illustrating a voltage-current characteristic of the semiconductor device of FIG. 13. In particular, FIGS. 14(a) and 14(b) illustrate improved electrical characteristics of the semiconductor device by using the two top gates is described in FIG. 13. For example, if the first channel 1340 is a p-type semiconductor layer or a nanowire, and the second channel 1350 is an n-type semiconductor layer or a nanowire, the curve of the first gate voltage $V_G$-current $I_M$ may be like a first curve 1400 illustrated in FIG. 14(a).

According to the description hereinabove, when a forward bias is applied through the first top gate 1301 and the application of the bias is cut off, the left side of the first curve 1400 is shifted towards 1401. However, when a reverse bias is applied through the first top gate 1301 and the application of the bias is cut off, the left side of the first curve 1400 is shifted towards 1402.

When the reverse bias is applied through the second top gate 1302 and the application of the bias is cut off, the right side of the first curve 1400 is shifted towards 1403. However, when the forward bias is applied through the second top gate 1302 and the application of the bias is cut off, the right side of the first curve 1400 is shifted towards 1404.

Consequently, when the top gate is separated in two and applied with different biases, the left and right parts of the first gate voltage $V_G$-current $I_M$ curve may be independently controlled. If the forward bias is applied through the first top gate 1301 and the reverse bias is applied through the second top gate 1302, and then the forward and reverse biases are cut off, the first gate voltage $V_G$-current $I_M$ curve may be like that shown in FIG. 14(b). That is, when a different polarity bias is applied to the two top gates, an ambipolar characteristic as shown in FIG. 14(b) may be obtained.

Figure 15:
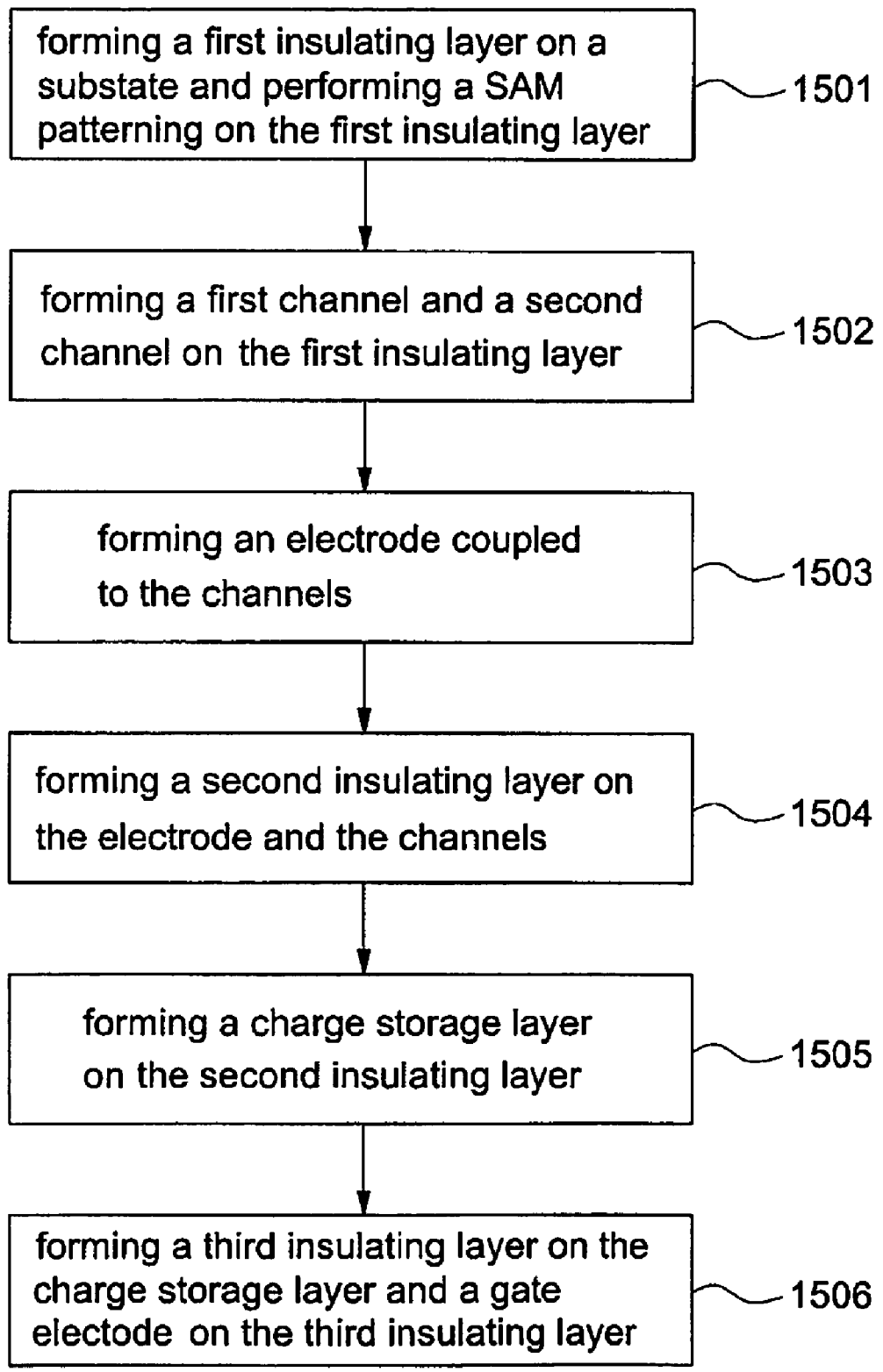
FIG. 15 is a flow diagram illustrating a method of manufacturing a semiconductor device in one embodiment.

FIG. 15 is a flow diagram illustrating a method of manufacturing a semiconductor device in one embodiment. Beginning in a block 1501, a first insulating layer is formed on a substrate, and a self-assembled monolayer (SAM) patterning is performed on the first insulating layer. In a block 1502, a first channel and a second channel are formed on the first insulating layer. In a block 1503, an electrode is coupled to the channels. In a block 1504, a second insulating layer is formed on the electrode and the channels. In a block 1505, a charge storage layer is formed on the second insulating layer. In a block 1506, a third insulating layer is formed on the charge storage layer and a gate electrode is formed on the third insulating layer.

Figure 16:
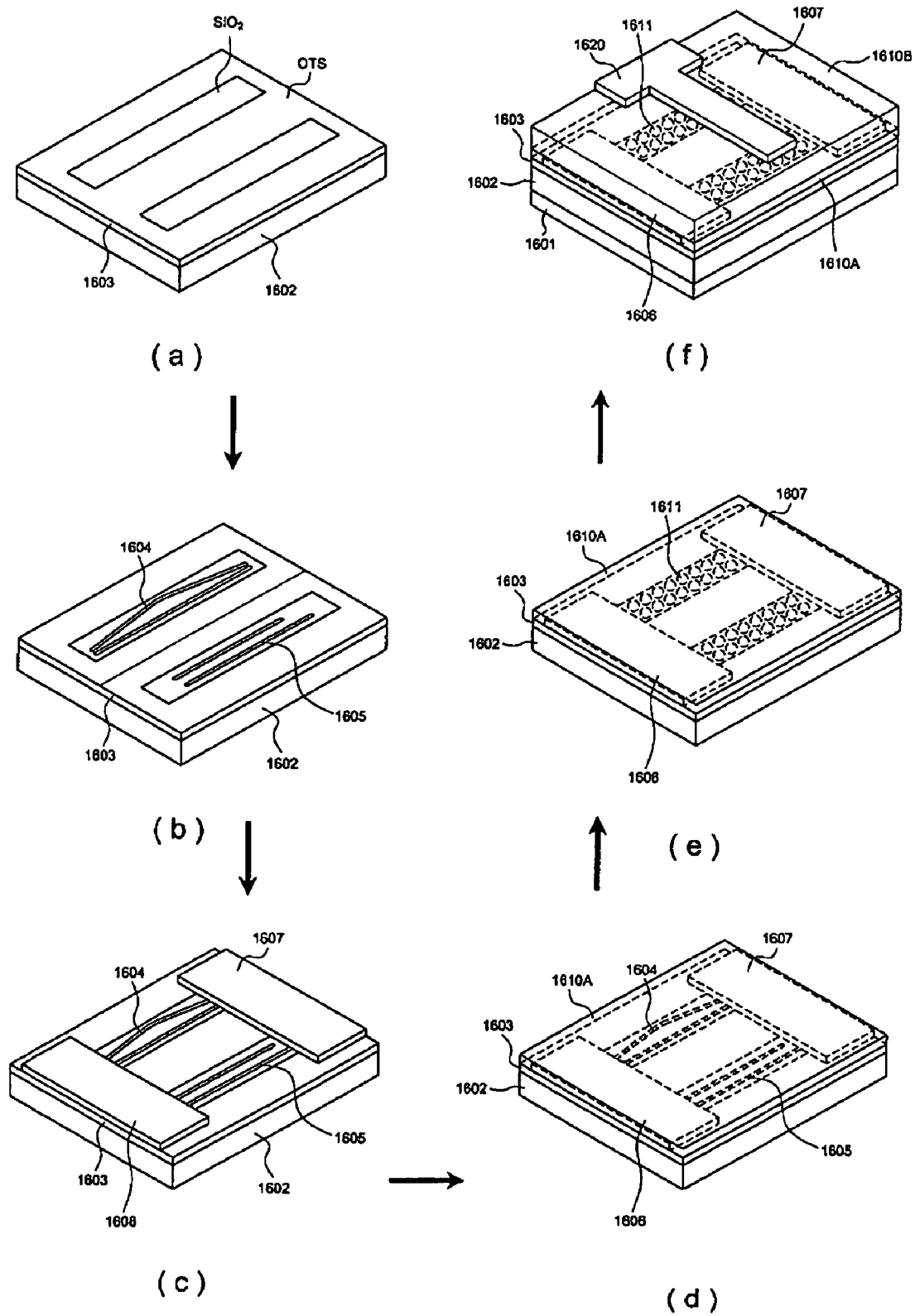
FIG. 16 is a diagram illustrating a process of manufacturing a semiconductor device in another embodiment.

FIG. 16 is a diagram illustrating a process of manufacturing a semiconductor device in another embodiment. FIG. 16(a) corresponds to block 1501 of forming a first insulating layer on a substrate and performing a self-assembled monolayer (SAM) patterning on the oxide film. Hereinafter, a semiconductor shown in FIG. 16(a) is described. First, the first insulating layer (e.g., an oxide film 1603) is formed on a semiconductor substrate 1602. Since the oxide film 1603 is located at the lowest end, it may be called the lower oxide film or lower insulating film. A first channel 1604 and a second channel 1605 are formed on the oxide film 1603. If the first channel 1604 and the second channel 1605 are formed by nanowires, the SAM patterning may be performed on the oxide film 1603. Through the SAM patterning, nanowires may be adsorbed at a particular portion of the oxide film 1603 while being prevented from being adsorbed at the remaining portion. For example, the adsorption of the nanowires can be prevented through forming an Octadecyltrichlorosilane (OTS) molecular film on the oxide film 1603.

FIG. 16(b) corresponds to block 1502 of forming a first channel and a second channel on the first insulating layer. A semiconductor shown in FIG. 16(b) is one embodiment which includes nanowires as its channels. In order to form an assembly of n-type nanowires on the oxide film 1603, the semiconductor device may be placed into an n-type nanowire solution. When the semiconductor device is placed in the n-type nanowire solution while protecting the part on the oxide film 1603 where a p-type nanowire is to be assembled, the n-type nanowire is assembled at the intended location. Further, when the semiconductor device is placed in a p-type nanowire solution while protecting the part on the oxide film 1603 where an n-type nanowire is to be assembled, a p-type nanowire is assembled at the intended location. An electrical potential may be applied in the nanowire solution in order to enhance the assembly. If a doped p-type or n-type channel is to be formed on the oxide film 1603, a first channel 1604 and a second channel 1605 may be formed using a conventional Physical Vapor Deposition (PVD) or chemical vapor deposition (CVD) method instead of the former described method.

FIG. 16(c) and FIG. 16(d) respectively correspond to block 1503 of forming an electrode coupled to the channels and block 1504 of forming a second insulating layer. Hereinafter, a semiconductor shown in FIG. 16(c) and a semiconductor shown in FIG. 16(d) are described. According to FIG. 16(c), terminal electrodes 1606 and 1607 coupled to the channels 1604 and 1605 may be formed through a photolithography process after forming the first channel 1604 and the second channel 1605. After forming the terminal electrodes 1606 and 1607, the second insulating layer (e.g., a thin oxide film 1610A shown in FIG. 16(d)) is formed on the terminal electrodes 1606 and 1607 and the channels 1604 and 1605.

FIG. 16(e) corresponds to block 1505 of forming a charge storage layer. Hereinafter, a semiconductor shown in FIG. 16(e) is described. If the charge storage layer 1611 includes nanoparticles, an OTS molecular film is formed on the thin oxide film 1610A to prevent the adsorption of nanoparticles. Nanoparticles are classified according to whether or not they are easily adsorbed to an oxide film. If nanoparticles which are not easily adsorbed to the oxide film are included, aminopropylethoxysilane (APTES) may be applied at a portion where the nanoparticles are formed. If the nanoparticles are surrounded by materials such as a COOH— chemical structure, the nanoparticles are not easily adsorbed to the oxide film. In this case, the APTES may be used as a linker molecule between the nanoparticles and the oxide film. If the charge storage layer 1611 is a planar conductive member, the charge storage layer may be formed by using a general floating gate fabrication process.

FIG. 16(f) corresponds to block 1506 of forming a third insulating layer on the charge storage layer and a gate electrode on the third insulating layer. Hereinafter, a semiconductor shown in FIG. 16(f) is described. The third insulating layer (e.g., a thick oxide film 1610B) is formed on the charge storage layer 1611 and the thin oxide layer 1610A, and gate electrodes 1601 and 1620 are formed on the thick oxide film 1610B and below the substrate 1602 respectively.

The disclosed semiconductor device and the method of manufacturing the same may be applied to various semiconductor devices and manufacturing methods without departing from the basic concept of the present disclosure. Accordingly, all the disclosed embodiments must be understood as being exemplary only and must not be construed to be the limit of the present disclosure. Accordingly, the range of protection for the present disclosure must be determined not by an embodiment described hereinabove, but by the attached claims. An alternative that is equivalent to the attached claims is included in the range of protection of the attached claims.

The invention claimed is:

1. A semiconductor device comprising:
an operating gate;
a substrate formed on the operating gate;
a first insulating layer formed on the substrate;
a first channel having a first polarity that is formed at a first planar position of the first insulating layer;
a second channel having a second polarity that is formed at a second planar position of the first insulating layer;
terminal electrodes coupled in common with the first channel and the second channel at their opposite ends;
a second insulating layer formed on the channels and the terminal electrodes;
a charge storage layer floated inside the second insulating layer and chargeable with an electrical charge; and
at least one control gate formed on the second insulating layer.

2. The semiconductor device of claim 1, wherein the charge storage layer is formed at a location corresponding with the first planar position and the second planar position.

3. The semiconductor device of claim 1, wherein the first channel is a p-type doped semiconductor layer and the second channel is an n-type doped semiconductor layer.

4. The semiconductor device of claim 1, wherein the first channel is a p-type doped nanowire and the second channel is an n-type doped nanowire.

5. The semiconductor device of claim 1, wherein a lower insulating sub-layer is formed between the charge storage layer and the channel, and is thin enough for tunneling to be possible.

6. The semiconductor device of claim 1, wherein the charge storage layer comprises a plurality of conductive particles.

7. The semiconductor device of claim 6, wherein the conductive particles are nanoparticles.

8. The semiconductor device of claim 1, wherein a forward bias or a reverse bias is applied to the control gate to control the operating characteristics of the semiconductor device.

9. The semiconductor device of claim 1, wherein a negative charge is charged in at least one part of the charge storage layer when a forward bias is applied to the control gate.

10. The semiconductor device of claim 1, wherein a positive charge is charged in at least one part of the charge storage layer when reverse bias is applied to the control gate.

11. The semiconductor device of claim 1, wherein at least one of the control gates includes a first control gate corresponding with the first channel and a second control gate corresponding with the second channel.

12. A semiconductor device comprising:
an operating gate;
at least a first and second channels formed above the operating gate and insulated from the operating gate, and wherein both the first and second channels have a first end and a second end;
a first terminal electrode adapted to couple together the first end of the first channel and the first end of the second channel,
a second terminal electrode adapted to couple together the second end of the first channel and the second end of the second channel;
a charge storage layer arranged adjacent to the first and second channels but insulated from the first and second channels; and
at least one control gate formed above the charge storage layer and insulated from the charge storage layer,
wherein the first channel comprises a p-type channel and the second channel comprises an n-type channel.

13. The semiconductor device of claim 12, wherein an absolute electrical potential of the operating gate required for a current to flow above a critical value through the p-type channel is reduced when, after the application of a forward bias to the operating gate, the bias is cut off.

14. The semiconductor device of claim 12, wherein an absolute electrical potential of the operating gate required for a current to flow above a critical value through the second channel is reduced when, after the application of a reverse bias to the operating gate, the bias is cut off.

15. The semiconductor device of claim 12, wherein the control gate includes a first control gate corresponding with the first channel and a second control gate corresponding with the second channel.

16. The semiconductor device of claim 15, wherein a forward bias is applied to the first control gate and a reverse bias is applied to the second control gate.

17. The semiconductor device of claim 12, wherein the first channel and the second channel are nanowires.

18. The semiconductor device of claim 12, wherein the charge storage layer comprises a plurality of nanoparticles.

19. A method of manufacturing a semiconductor device, comprising:
forming a first insulating layer on a substrate;
forming a first channel having a first polarity at a first planar position of the first insulating layer and a second channel having a second polarity at a second planar position of the first insulating layer;
forming a plurality of terminal electrodes coupled in common with the first channel and the second channel at their opposite ends;
forming a second insulating layer on the channel and the terminal electrodes;
forming a charge storage layer on the second insulating layer that is chargeable with an electrical charge and that corresponds with the first planar position and the second planar position;
forming a third insulating layer on the charge storage layer; and
forming an operating gate below the first insulating layer and a control gate on the third insulating layer.

20. The method of claim 19, wherein the first channel and the second channel are nanowires formed in a nanowire solution.

21. The method of claim 20 further comprising forming a film that prevents nanowire adsorption on a remaining region except for the first planar position and the second planar position.

22. The method of claim 21, wherein the film that prevents nanowire adsorption is an octadecyltrichlorosilane molecular film.

23. The method of claim 19, wherein the charge storage layer is formed with a plurality of nanoparticles.

24. The method of claim 23 further comprising forming a linker film for the adsorption of nanoparticles on at least one part of the second insulating layer.

25. The method of claim 24, wherein the linker film is an aminopropylethoxysilane (APTES) film.

26. The method of claim 19, wherein the terminal electrodes comprise gold or titanium.

* * * * *

UNITED STATES PATENT AND TRADEMARK OFFICE
CERTIFICATE OF CORRECTION

PATENT NO.        : 7,968,935 B2                                    Page 1 of 1
APPLICATION NO.   : 12/197961
DATED             : June 28, 2011
INVENTOR(S)       : Hong et al.

It is certified that error appears in the above-identified patent and that said Letters Patent is hereby corrected as shown below:

In Fig. 15, Sheet 12 of 13, for Tag "1501", in Line 2, delete "substate" and insert -- substrate --, therefor.

In Fig. 15, Sheet 12 of 13, for Tag "1506", in Line 3, delete "electode" and insert -- electrode --, therefor.

In Column 10, Line 16, in Claim 12, delete "channel," and insert -- channel; --, therefor.

Signed and Sealed this
Nineteenth Day of June, 2012

David J. Kappos
*Director of the United States Patent and Trademark Office*

UNITED STATES PATENT AND TRADEMARK OFFICE
CERTIFICATE OF CORRECTION

PATENT NO. : 7,968,935 B2
APPLICATION NO. : 12/197961
DATED : June 28, 2011
INVENTOR(S) : Hong et al.

Page 1 of 1

It is certified that error appears in the above-identified patent and that said Letters Patent is hereby corrected as shown below:

In the Specifications

In Column 5, Line 28, delete "first gate 190." and insert -- first gate 110. --, therefor.

In Column 6, Line 38, delete "first gate 190." and insert -- first gate 110. --, therefor.

Signed and Sealed this
Eleventh Day of June, 2013

Teresa Stanek Rea
*Acting Director of the United States Patent and Trademark Office*